United States Patent
Liaw

(10) Patent No.: US 9,276,108 B2
(45) Date of Patent: Mar. 1, 2016

(54) MEMORY CELL ARRAY AND CELL STRUCTURE THEREOF

(71) Applicant: Taiwan Semiconductor Manufacturing Company Limited, Hsinchu (TW)

(72) Inventor: Jhon-Jhy Liaw, Hsinchu County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 58 days.

(21) Appl. No.: 14/315,383

(22) Filed: Jun. 26, 2014

(65) Prior Publication Data

US 2015/0380547 A1    Dec. 31, 2015

(51) Int. Cl.
  *H01L 29/66* (2006.01)
  *H01L 21/337* (2006.01)
  *H01L 29/78* (2006.01)
  *H01L 27/112* (2006.01)
  *H01L 27/24* (2006.01)

(52) U.S. Cl.
  CPC ...... *H01L 29/7827* (2013.01); *H01L 27/11273* (2013.01); *H01L 27/2454* (2013.01)

(58) Field of Classification Search
  CPC ............ H01L 29/7827; H01L 27/2454
  USPC ............ 438/192, 173–178; 257/263
  See application file for complete search history.

(56) References Cited

U.S. PATENT DOCUMENTS

2014/0091272 A1*  4/2014  Liao ............ H01L 45/08
                                                 257/4

* cited by examiner

*Primary Examiner* — Calvin Lee
(74) *Attorney, Agent, or Firm* — Jones Day

(57) ABSTRACT

A read-only memory (ROM) cell array and a cell structure thereof is disclosed. The ROM cell array is coupled to a plurality rows of bit-lines and a plurality columns of word-lines and comprises: a plurality of sub-cell-arrays arranged along the column direction, each sub-cell-array comprising a plurality of unit cell structures. Each unit cell structure comprises: an cell base region defining a cell boundary, comprising an blanket OD layer having a wide-block profile arranged on a substrate and defining a continuous common source node, a drain pad disposed above the OD layer, arranged in selectively connection with a bit line, a vertical channel structure bridging between the drain pad and the OD layer, and a gate structure disposed vertically between the drain pad and the OD layer and arranged in connection with a word-line. The sub-cell-array boundary is defined entirely within the coverage of the OD layer.

20 Claims, 10 Drawing Sheets

| | Gate strap cells | | Gate strap cells | | Gate strap cells | |
|---|---|---|---|---|---|---|
| OD(Vss) strap cell | ROM mini array-3 (>2x2 cells) | OD(Vss) strap cell | ROM mini array-6 (>2x2 cells) | OD(Vss) strap cell | ROM mini array-9 (>2x2 cells) | OD(Vss) strap cell |
| | Gate strap cells | | Gate strap cells | | Gate strap cells | |
| OD(Vss) strap cell | ROM mini array-2 (>2x2 cells) | OD(Vss) strap cell | ROM mini array-5 (>2x2 cells) | OD(Vss) strap cell | ROM mini array-8 (>2x2 cells) | OD(Vss) strap cell |
| | Gate strap cells | | Gate strap cells | | Gate strap cells | |
| OD(Vss) strap cell | ROM mini array-1 (>2x2 cells) | OD(Vss) strap cell | ROM mini array-4 (>2x2 cells) | OD(Vss) strap cell | ROM mini array-7 (>2x2 cells) | OD(Vss) strap cell |
| | Gate strap cells | | Gate strap cells | | Gate strap cells | |

Fig.4

MEMORY CELL ARRAY AND CELL STRUCTURE THEREOF

TECHNICAL FIELD

The present invention relates generally to semiconductor memories, and, more particularly, to semiconductor read-only-memory (ROM) cell array structure.

BACKGROUND

Conventional ROM cell arrays that utilize planar cell transistors inherently present a heavy horizontal footprint on the planar surface of a substrate, thus imposing a practical restriction on the downward scaling of a memory cell. Accordingly, a memory cell array and a cell structure thereof are proposed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 shows an overhead schematic diagram of a memory cell array in accordance to one embodiment of the instant disclosure.

DETAILED DESCRIPTION

Figure 1A:
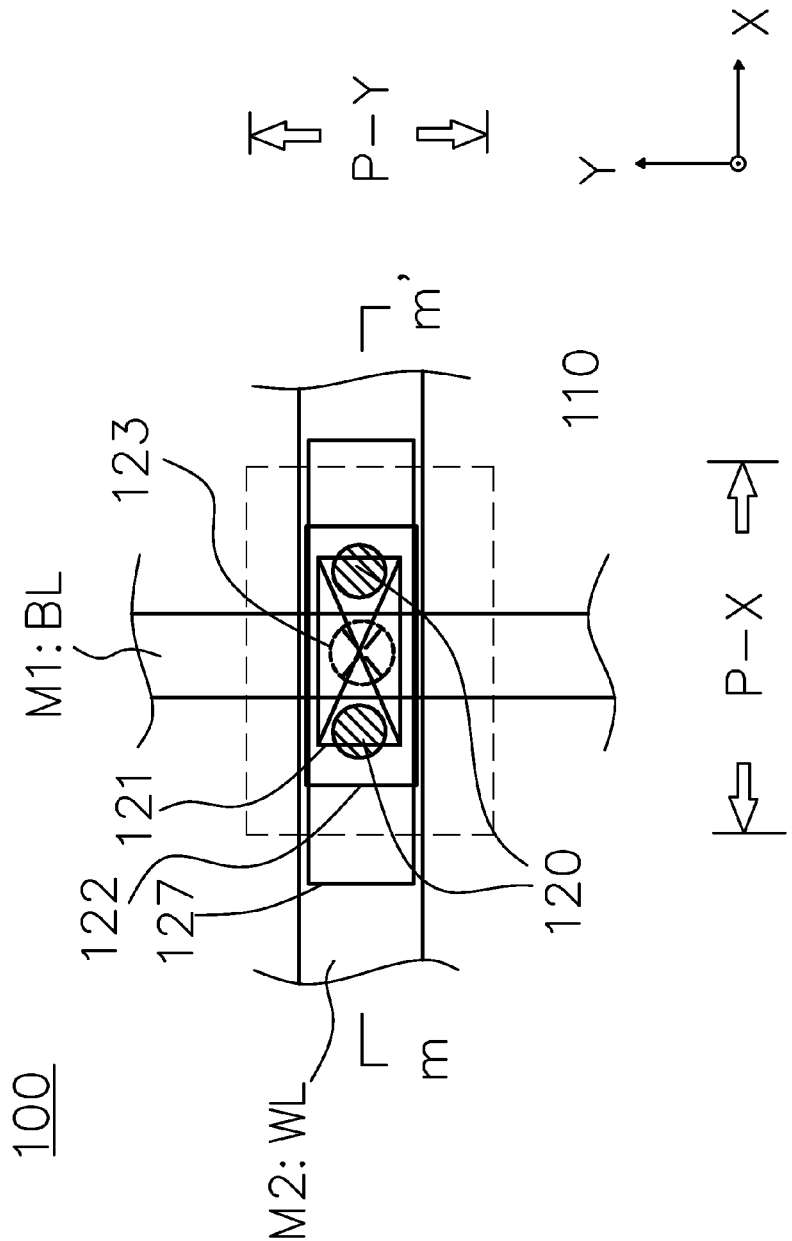
FIG. 1A shows an overhead structural diagram illustrating a ROM cell structure in accordance with one embodiment of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor ROM is a type of solid state memory device made up of rows and columns of ROM cells in a cell array, fabricated with desired data permanently stored therein. The stored data in the ROM cell array can then be accessed through a matrix of word-lines and bit-lines. Typically, each ROM cell includes one transistor that's configured either in an "on (1)" state or an "off (0)" state when being selected by a word-line and a bit-line. Word-lines are typically coupled to the gates of the cell transistors. Bit-lines are typically coupled to the drains of the cell transistors while sources thereof are typically coupled to a ground (VSS). The coding of the "on" or "off" states in a ROM cell may depend on whether the path from the source to the VSS through a particular cell transistor is electrically connected or isolated. Such path can be implemented through a mask, such as contact, via, or active region (OD). For instance, when a source contact to the VSS is absent for a cell transistor, the cell transistor is in an "off" state.

Figure 5A:
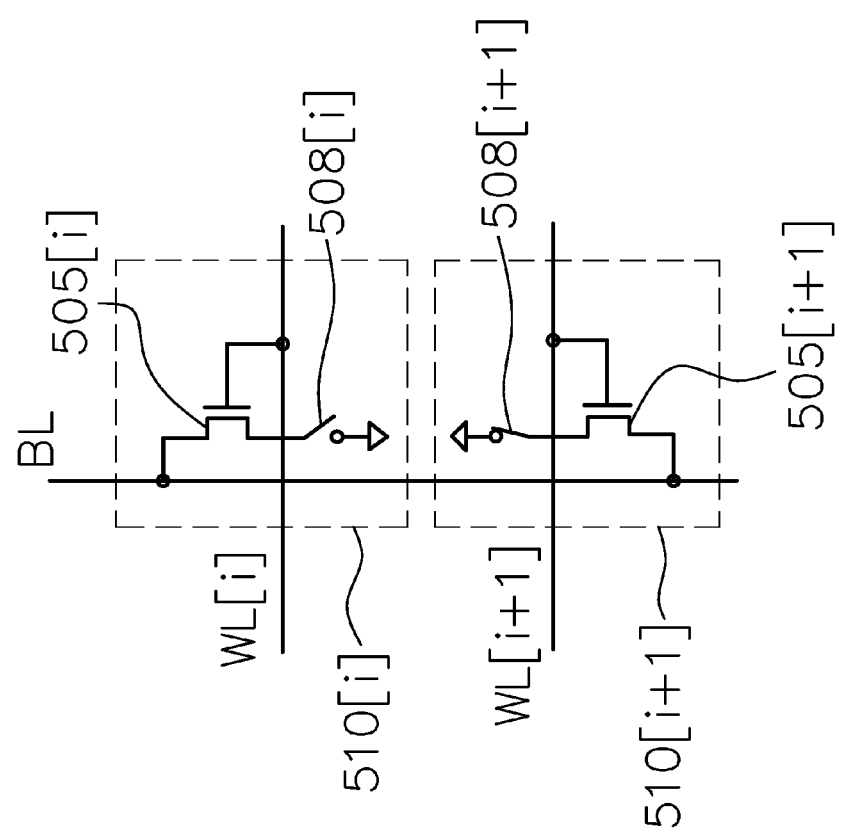
FIG. 5A is an exemplary schematic diagram illustrating a ROM cell array.

FIG. 5A is a schematic diagram illustrating an exemplary [2R×1C] ROM cell column array with two exemplary memory cells $510[i]$ and $510[i+1]$. In memory cell $510[i]$, an NMOS transistor $505[i]$ has a gate and a drain connected to a word-line (WL$[i]$) and a bit-line (BL), respectively. A source of the NMOS transistor $505[i]$ is disconnected from a ground (VSS), i.e., floating, by opening a switch $508[i]$. Therefore, when the memory cell $510[i]$ is selected by activating both the WL$[i]$ and BL, the BL will not detect any current, which may be interpreted as a logic "0". In contrast, in memory cell $510[i+1]$, a NMOS transistor $505[i+1]$ has a gate and a drain connected to a word-line (WL[i+1]) and the same BL, respectively. A source of the NMOS transistor $505[i+1]$ is connected to the VSS by closing a switch $508[i+1]$. Therefore, when the memory cell $510[i+1]$ is selected by activating both the WL[i+1] and BL, the BL will detect a conduction current of the NMOS transistor $105[i+1]$, which may be interpreted as a logic "1" Please note the two separated dash line enclosures that respectively represent the memory cell boundaries $510[i]$ and $510[i+1]$. Reduced unit cell area is preferable for achieving higher cell density in order to meet the down-size scaling trends.

Figure 5B:
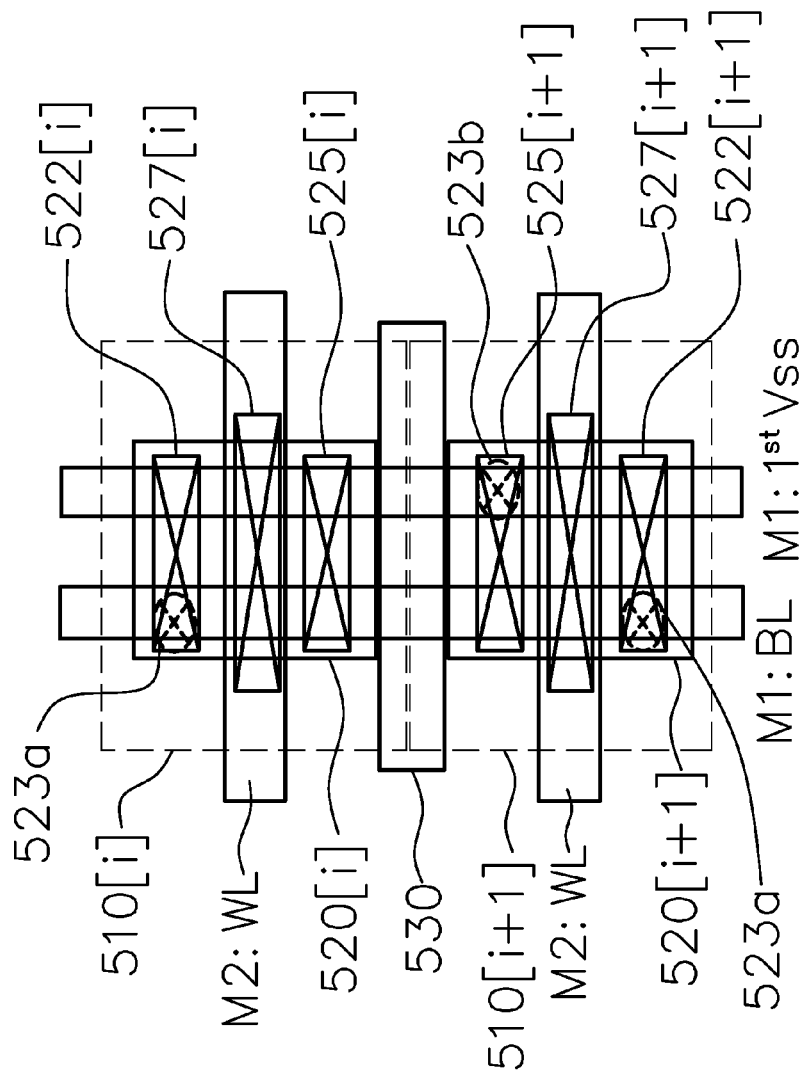
FIG. 5B shows an overhead structural diagram illustrating a layout implementation of the ROM cell array of FIG. 5A.

Please refer to FIG. 5B, which shows an overhead diagram illustrating a layout implementation of a conventional ROM cell array of FIG. 5A. A conventional ROM cell array predominantly utilizes planar transistors in the memory cells thereof, as shown here. Memory cell $510[i]$ comprises an NMOS transistor having a drain region $522[i]$, a gate $527[i]$, and a source region $525[i]$ horizontally laid on a planar active region (OD) 520[*i*]. Likewise, memory cell 510[*i*+1] comprises an NMOS transistor having a drain region 522[*i*+1], a gate 527[*i*+1], and a source region 525[*i*+1] horizontally laid on a planar active region (OD) 520[*i*+1]. An isolation structure, such as a shallow trench isolation (STI) 530 is required between the bordering OD regions of the adjacent cells 510[*i*] and 510[*i*+1] to electrically separate the source/drain regions of the neighboring transistors. Above the ROM cells in the first level conducting layer are the bit-line and the Vss line running longitudinally across the memory cells 510[*i*] and 510[*i*+1]. The drain regions 522[*i*] and 522[*i*+1] of the two memory cells are respectively connected to the bit-line through contacts/vias 523*a*.

The coding of the ROM cells may be implemented through selective connection between the source node to the VSS through a conducting structure (e.g., a coding layer), such as via/contact 523*b*. In the instant example, there is no contact in the source region 525[*i*] in ROM cell 510[*i*], while the source region 525[*i*+1] is connected to the Vss line through the contact/via 523*b*. This particular implementation sets the logical states of ROM cells 510[*i*] and 510[*i*+1] to "off" and "on", respectively. Please note the relatively ineffective (planar) space usage of the horizontally configured cell transistors, as well as the valuable (planar) space occupied by the STI in a memory cell.

For conventional ROM cell arrays, the planar layout of the cell transistors, which inherently present a heavy horizontal footprint on the planar surface of a substrate wafer, imposes a practical restriction on the downward scaling of a memory cell. Moreover, the inevitable inclusion of STI in the area of a memory cell also takes up valuable space. Furthermore, as processing technology enters the nanometer era, the cell transistors exhibit a significant sensitivity to its layout environment, among which are poly spacing effect (PSE) and shallow-trench-isolation (STI) stress effect (LOD) and strain effect. These layout related effects may adversely affect the sensing margins of the memory cells, thus further obstructing the downward sealing of a memory cell structure.

For the ease and accuracy of orientation referral, a x-y-z coordinate reference is now provided, in which the x-axis is generally orientated along a row direction, the y-axis is generally oriented along a column direction, while the z-axis is oriented generally along the vertical direction with respect to the planar surface of a substrate.

Figure 1B:
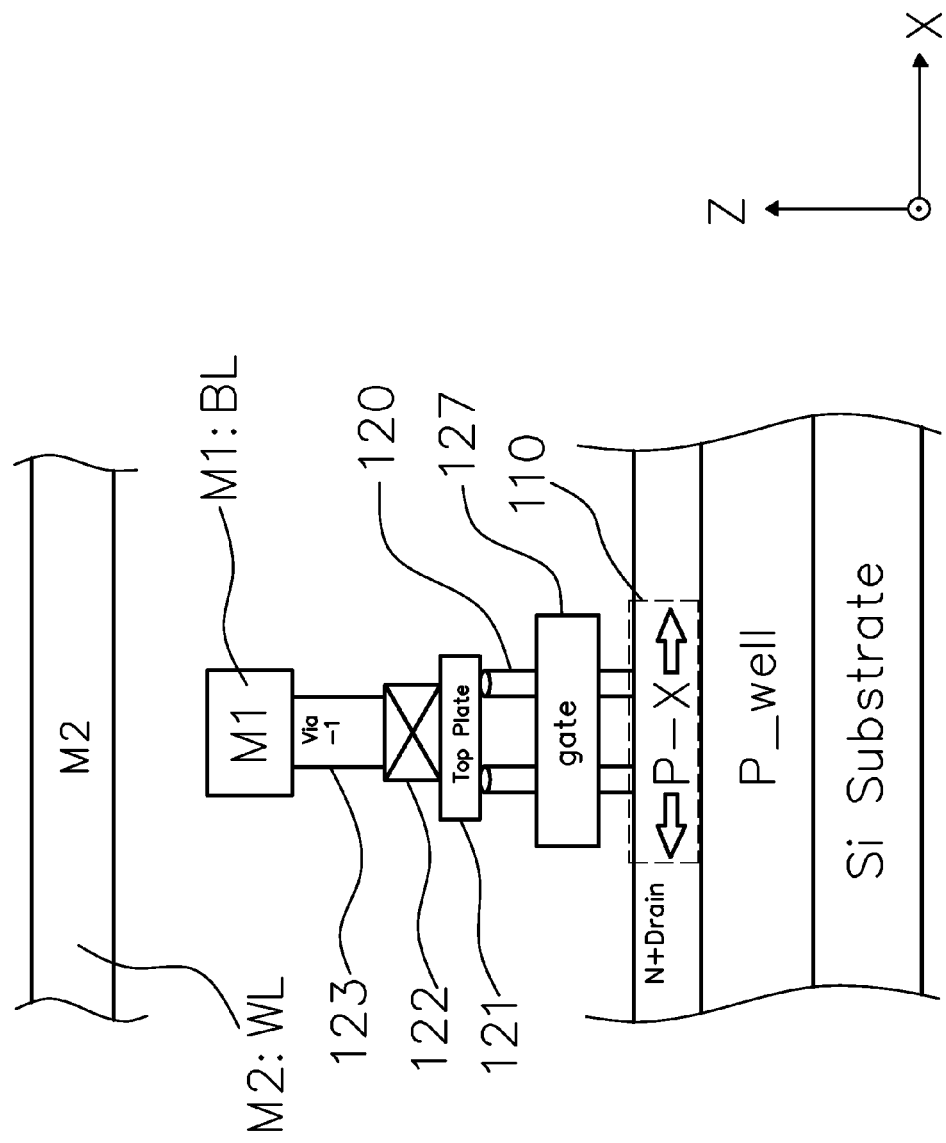
FIG. 1B shows an lateral cross-sectional view of the ROM cell structure of FIG. 2A, taken along line m-m' in accordance with one embodiment of the instant disclosure.

Please refer concurrently to FIGS. 1A and 1B. FIG. 1A shows an overhead structural diagram illustrating a ROM unit cell structure in accordance with one embodiment of the instant disclosure, while FIG. 1B illustrates a lateral cross-sectional view of the ROM unit cell structure of FIG. 1A, taken along line m-m'. The exemplary ROM cell structure incorporates a vertical channel device as cell transistor. A vertical channel device generally incorporates a relatively novel design architecture, in which the source and drain regions of the device are arranged vertically with respect to the planar surface of the wafer/substrate. The channel structure of the transistor device extends substantially vertically, bridging between the source and the drain regions, defining a vertical channel direction. Exemplary devices that adopt this novel arrangement include the vertical gate-all-around (VGAA) field effect transistors (FETs) and the vertical tunneling field effect transistors (TFETs), though other types of vertical channel device may emerge in the future. As the source, channel, and drain regions of the device are arranged in a vertical stack with respect to the planar surface of a substrate, the vertical channel architecture not only offers a significant reduction in horizontal profile, it also enables more effective current control through the channel, thereby allowing the implantation of shorter gates.

FIG. 1A shows an overhead structural diagram illustrating a ROM cell structure in accordance with one embodiment of the instant disclosure. The exemplary ROM unit cell structure (100) has a substantially rectangular cell base region (110) defined on an active region (OD) of a substrate, defining a cell boundary (i.e., an x-cell-pitch along the x-axis and a y-cell-pitch along the y-axis). The active region (OD) is generally a heavily doped layer of either n-type or p-type, which serves as the source region of a vertical channel device disposed thereon. In some embodiments, a silicide layer (not shown) may be formed upon the OD layer. Suitable silicide materials may include Ti, Co, Ni, Mo, Pt, or a combination thereof.

Figure 2A:
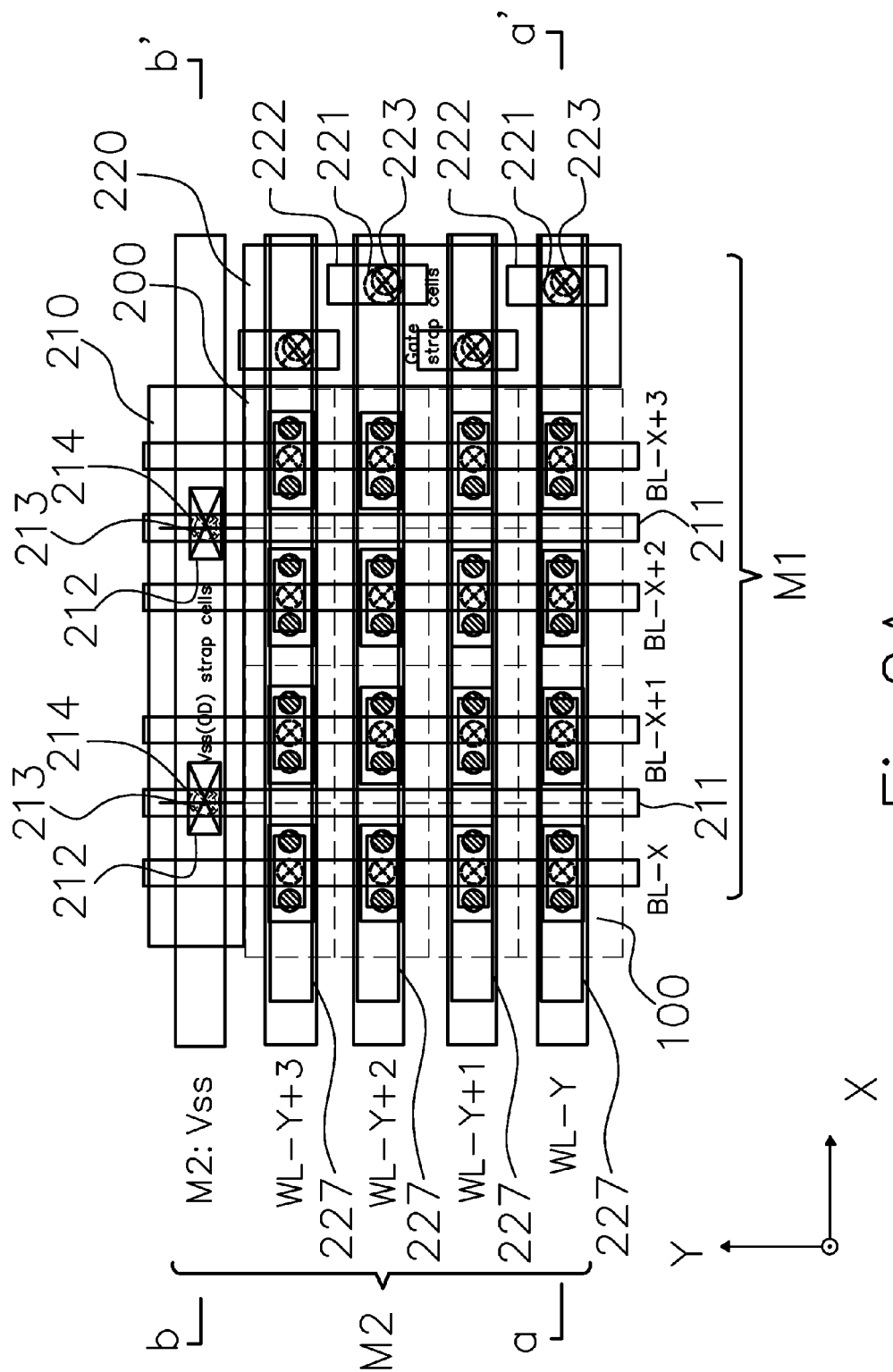
FIG. 2A shows an overhead structural diagram illustrating a layout implementation of a portion of a memory cell array in accordance with one embodiment of the instant disclosure.

FIG. 1B shows an lateral cross-sectional view of the ROM cell structure of FIG. 2A, taken along line m-m' in accordance with one embodiment of the instant disclosure. The instant embodiment employs a vertical gate all-around (VGAA) device, which generally comprises at least one vertically extending pillar (120) bridging between a source region (i.e., the N+ type OD) on the bottom and a drain region (e.g., the drain pad (122)) on the top to provide a carrier channel, and a horizontally surrounding gate structure (127) wrapping around a middle section thereof to provide channel control. It should be noted that, while the instant example illustrates the use of a VGAA transistor, other types of vertical channel devices may also be adapted. The vertically extending pillar (120) defines a substantially vertical channel direction (along z-axis), and the vertical length thereof defines the channel length of the VGAA device.

For an n-type VGAA device, the OD may be a layer of heavy n-type species arranged on a p-type well in a silicon based substrate that serves as the source region of the cell transistor. In other embodiments, the OD may be a layer of n-type epi-grown compound material on a p-type well in a silicon based substrate. The epi-grown material for the OD layer may include SiP content, SiC content, SiPC, Si, Ge, III-V materials, or suitable combinations thereof. The III-V material may include InP, InAs, GaAs, AlInAs, InGaP, InGaAs, GaAsSb, GaPN, and AlPN.

For a p-type VGAA device, the OD (source region) may be a heavily doped p-type layer arranged on a n-type well in a silicon based substrate. Suitable source/drain material of a p-type VGAA device may include epi-grown compound materials, such as SiGe, Ge, Ge-content, SiP, SiC, III-V materials, or a combination thereof.

The channel structure (e.g., pillar (120)) of the VGAA device is generally made up of at least one vertically extending nano-scaled structure, such as a nano-bar/tube/wire. In some embodiments, an array of vertical nano-scaled channels are utilized to provide greater on-state current capacity. Suitable materials for the nanowire channel region may include Si content or epi-grown materials, such as SiGe, SiGeC, Ge, Si, III-V materials, or a combination thereof. The provision of nanobar may utilize either the bottom-up approach (e.g., by selectively growing of suitable material into a desired nano-scaled structure) or the top-down approach (e.g., by precisely reducing a bulk amount of suitable material down to a desired nano-scaled structure), or suitable combinations thereof. In some embodiments, the nanobar may be obtained by first providing a silicon-based bulk material, doped at proper depth and locations to define the source/drain regions, then precisely etched and reduced to a desirable nano-profile. In some applications, indium gallium arsenide (InGaAs) nanowires may be used because of the better electron mobility they provide.

Referring to FIGS. 1A and 1B, the exemplary ROM cell structure (100) comprises a VGAA device that utilizes a pair of vertically extending nano-scaled pillars (120) as channel structures. Each of these vertically standing nano-channels has a bottom/root portion disposed on and in connection with the source region (i.e., the OD), and has at least a segment thereof (e.g., the middle segment, as illustrated) horizontally surrounded by the gate (127). The top end portion of the pillar (120) is arranged in connection with an elevated top plate/pad (121) arranged above the top surface of the OD layer, which defines the drain region of the VGAA device. The top drain pad (121) is in turn connected to a first level bit-line (M1: BL) arranged above and across the cell transistor along the column (y-axis) direction.

The connection between the drain plate (121) of the VGAA device to the bit-line (M1: BL) may be established through a suitable combination of conductive elements, including an optional silicide contact layer (122) disposed on the drain plate (121) and a first level via (123). The silicide material for the drain contact layer (122) may include Ti, Co, Ni, Mo, Pt, or a combination thereof. In some embodiments, the coding of the cell transistor may be implemented through the selective establishment of conduction path between the top drain plate (121) and the first level bit-line (M1: BL), instead of an altering the connection between a source of a memory cell transistor and a Vss conductor. Therefore, the conducting elements that create a connection between the drain pad (121) and the bit-line (M1: BL) may individually or collectively serve as a coding layer for the ROM cell transistor.

Figure 1C:
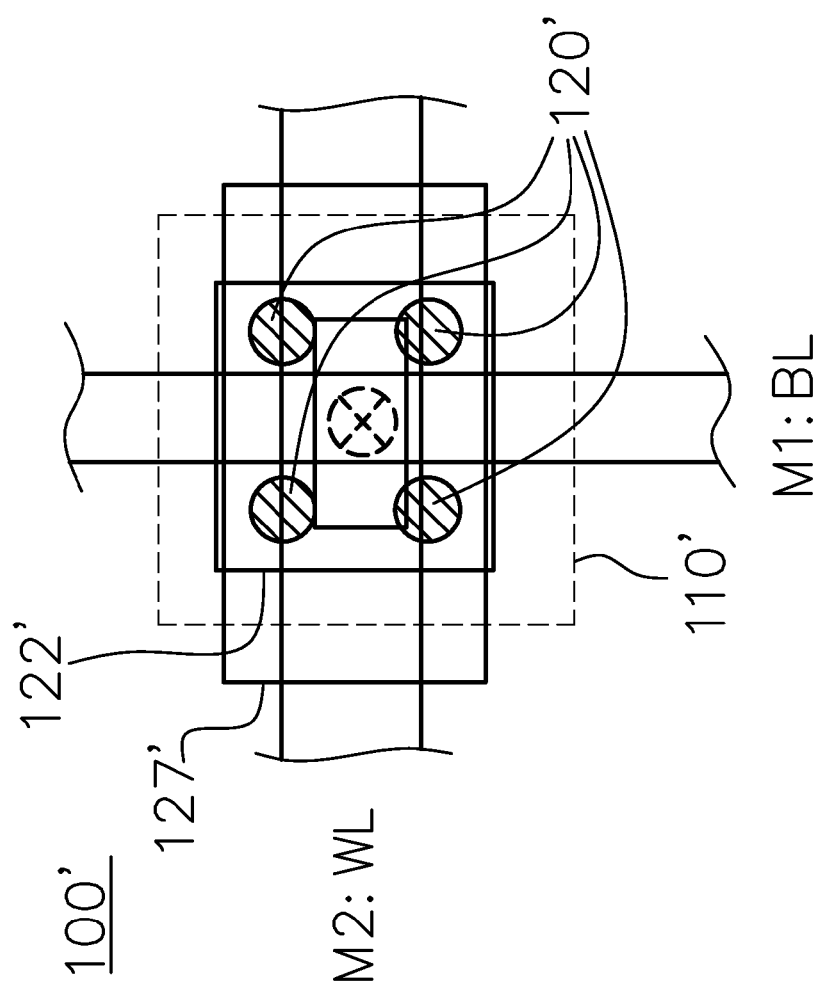
FIG. 1C shows an overhead structural diagram illustrating a ROM cell structure in accordance with another embodiment of the instant disclosure.

FIG. 1C shows an overhead structural diagram illustrating a ROM cell structure in accordance with another embodiment of the instant disclosure. In some embodiments, more nano-scaled pillars are utilized. For example, in the exemplary embodiment shown in FIG. 1C, the VGAA device comprises four vertical pillars (120') as channels. A slightly wider top plate/drain pad (122') may be employed to accommodate the increased number of vertical channels. Moreover, in some embodiments, a ROM cell structure may comprise more than one VGAA transistor within the cell boundary thereof. While the number of channels/vertical devices may be altered to meet a particular practical operational requirement, both of the abovementioned embodiments utilize a wide block-profiled OD cell base region (110/110') as the source nodes local ground (Vss) connection path, whose planar coverage includes substantially the entire memory cell area (i.e., cell boundary). This arrangement contributes to the minimization of the ROM cell size by eliminating the need for a separate source node (OD) connection area within the ROM cell. Compared with the conventional ROM cell arrays, the employment of the new VGAA device may allow at least 50% cell size reduction.

Referring back to FIGS. 1A and 1B, the all around gate (127) may be a metal gate and generally comprises: a stack structure that comprises a gate dielectric layer disposed on the vertical channel (e.g., pillar (120)) around the lateral surface thereof; a work-function metal layer disposed laterally over the gate dielectric layer; and, a metal layer disposed laterally over the work-function metal layer. The vertical height (thickness) of the gate defines the gate length of the device. In some embodiments, the height of the gate stack is arranged to substantially match the height of the vertical channel stack, thereby establishing greater lateral coverage of the gate around the channel for better channel control.

The dielectric layer of the all around gate is may be made of high-K dielectric. Suitable materials for the gate dielectric layer may include SiO2, SiON, Si3N4, Ta2O5, Al2O3, PEOX, TEOS, nitrogen content oxide layer, nitride oxide, Hf content oxide, Ta content oxide, Al content oxide, high K materials with a dielectric constant greater than 10, or a combination thereof. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. Exemplary high K dielectric materials may include Si3N4, SiC, SiON, Hf content oxide, HfSi oxide, Lu content oxide, Al content oxide, Zr content oxide, Ta content oxide, Ti content oxide, Sr content oxide, and combinations thereof.

The gate dielectric layer may be formed using a suitable process such as atomic layer deposition (ALD), chemical vapor deposition (CVD), physical vapor deposition (PVD), thermal oxidation, UV-ozone oxidation, or combinations thereof. The gate dielectric layer may further comprise an interfacial layer (not shown) to reduce damage between the gate dielectric layer and the lateral contact surface of the channel structure (e.g., the nano-wire channel (120)). The interfacial layer may comprise silicon oxide. Suitable material for the work-function layer of the gate stack may include TiN, TaN, TiAL, TaAl, Ti-content, Ta-content, Al-content, W-content, TiSi, NiSi, and PtSi. The metal gate electrode layer may include materials such as poly-silicon with silicide, Al content, Cu content, W content, Ti content, Ta content, nitrogen content, refractory materials (such as TiN, TaN, TiW, TiAl), and other conductive materials with a work function compatible with the material of the inner stack layers, or combinations thereof. For instance, the metal gate may be selected from materials such as Al, AlCu, Cu, TiN, TiW, TaH, Au, Ag silicide, refractory metal, and a suitable combination thereof. The gate electrode layer may be formed using a suitable process such as ALD, CVD, PVD, plating, or combinations thereof.

FIG. 2A shows an overhead structural diagram illustrating a layout implementation of a portion of a memory cell array in accordance with one embodiment of the instant disclosure. Specifically, in the exemplary ROM cell array, three types of cell regions are defined on a continuous OD region of a substrate: a sub cell array (200) region occupying the majority area in the cell array; a Vss/OD strap cell (210) region having a transversely extending (along x-axis) long narrow profile, arranged immediately adjacent to the sub cell array (200) along a column direction (i.e., arranged substantially in-line with the sub cell array (200) along the y-direction); and a gate strap cell (220) region having a longitudinally extending (along y-axis) long narrow profile, arranged immediately adjacent to the sub cell array (200) along a row direction (i.e., arranged substantially in-line with the sub cell array (200) along the x-direction). As the column and the row directions in a cell array are mainly designated for referencing purposes, these orientations are essentially interchangeable.

A plurality of elevated first level conducting lines (M1) are arranged above (i.e., vertically, in the z-direction) and across the column arrays (i.e., the Vss/OD strap cell (210) and the sub cell array (200), which are arranged in a column). Furthermore, a plurality of elevated second level conducting lines (M2) are arranged above (i.e., vertically, in the z-direction) and across the first level lines (M1) and the row arrays (i.e., the sub cell array (200) and the gate strap cell (220), which are arranged in a row). In the instant embodiment, the first level conducting lines (M1) includes four substantially regularly spaced and abreast extending bit-lines (BL-X, BL-X+1, . . . BL-X+3) extending generally along the column (y-axis) direction, as well as two interposing first level Vss lines (211) arranged between bit-lines (BL-X, BL-X+1) and bit-lines (BL-X+2, BL-X+3), respectively. The second level lines (M2), on the other hand, includes four substantially regularly spaced and abreast extending word-lines (WL-Y, WL-Y+1, WL-Y+2) extending generally along the row (x-axis) direction, as well as a second level Vss line (M2: Vss) extending transversely above and across the Vss/OD strap cell (210) region.

While the instant example features a substantially orthogonal cell arrangement, in which the column direction (i.e., y-axis) and the row direction (i.e., x-axis) are substantially perpendicular to each other, other arrangements may also be adopted. By way of example, some embodiments may utilize an screwed/angled column-row axes pattern rather than a orthogonal array arrangement. The actual implementation of a cell pattern thus should depend on specific operational requirements and/or practical needs, and is not limited to the exemplary arrangement illustrated herein.

Referring again to FIG. 2A, the exemplary sub cell array (200) is essentially a sub-array made up by a plurality of unit ROM cell structures (100) as shown in FIG. 1A. Particularly, the exemplary sub-cell-array (200) comprises sixteen unit cell structures, arranged in a four row by four column [4R× 4C] array pattern. As mentioned previously, each of the unit cell structure (100) has a cell base region (110) comprising a continuous OD layer that defines the source of the cell transistor housed thereon. Compared with a conventional ROM cell arrays (such as the one shown in FIG. 5B) that employs substrate-planted isolation structures (e.g., STI (530)) to isolate the drain/source regions of the adjacent cells (510[i]/510[i+1]) from each other, the OD layers of the unit cell structures (100) in the exemplary sub cell array (200) are continuously joined with no substrate-based isolation device planted there-between. The absence of in-substrate isolation devices allows more effective utilization of the limited substrate planar space, thereby increasing cell density in the memory array.

Figure 3A:
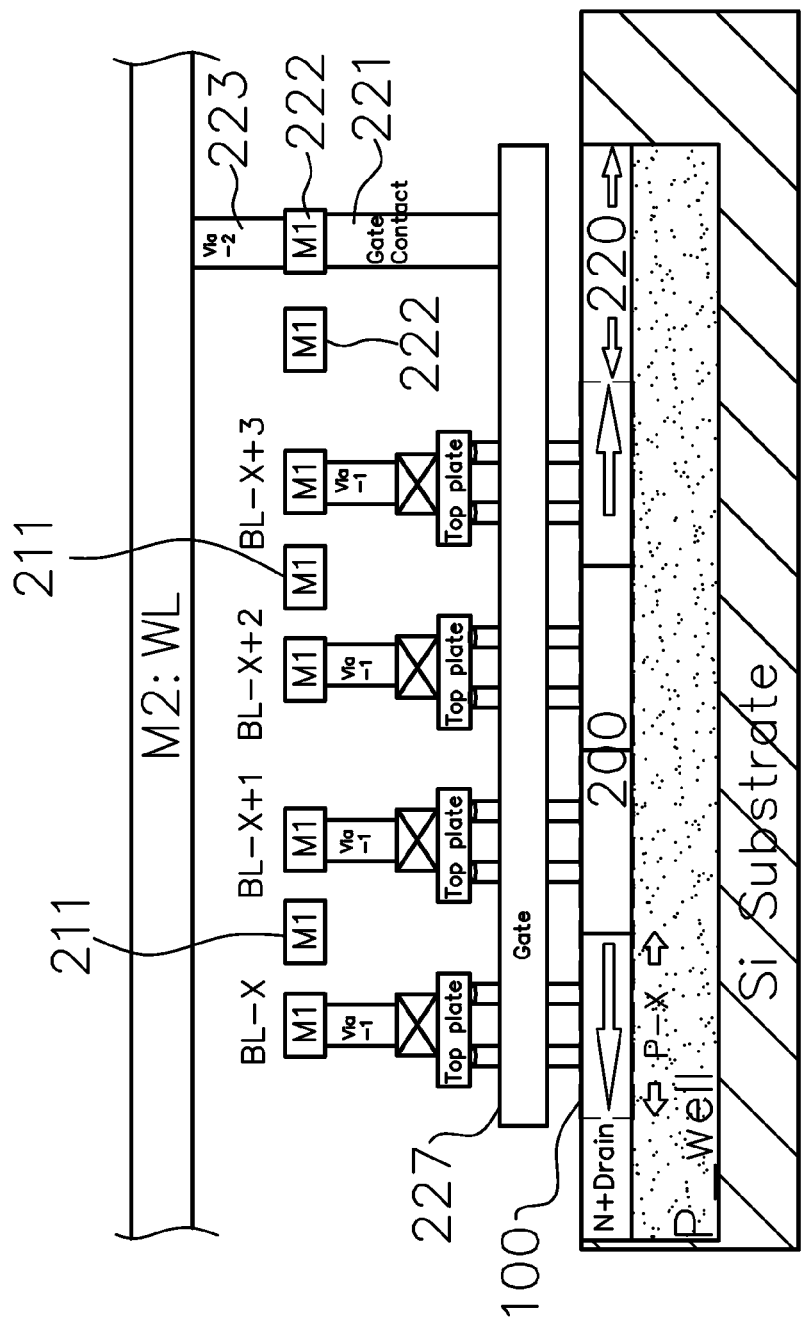
FIG. 3A shows a lateral cross-sectional view of the memory cell array as shown in FIG. 2A, taken along the line a-a' in accordance with one embodiment of the instant disclosure.
Figure 3B:
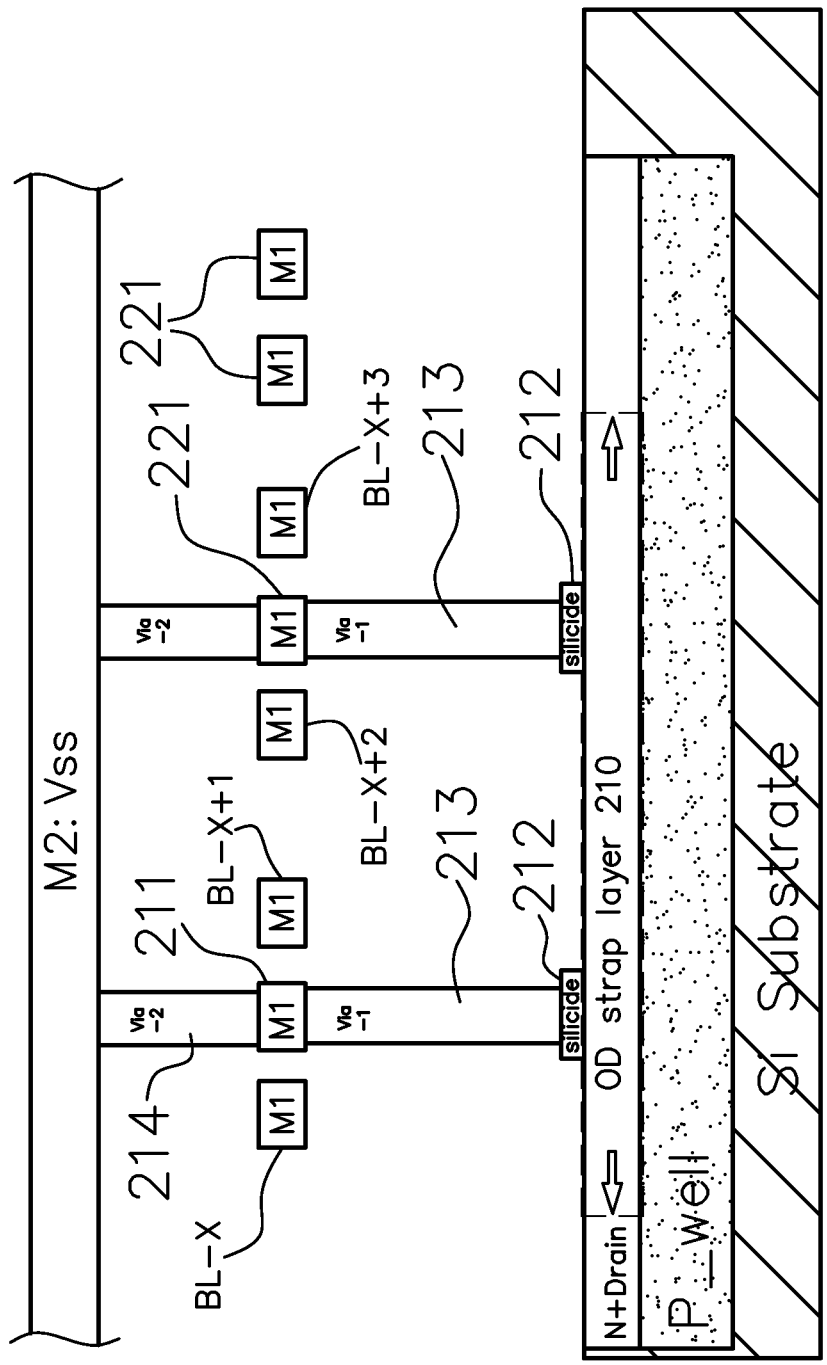
FIG. 3B shows a lateral cross-sectional view of the memory cell array as shown in FIG. 2A, taken along the line b-b' in accordance with one embodiment of the instant disclosure.

Please refer back to FIG. 2A in conjunction with FIG. 3B, which shows a lateral cross-sectional view of the memory cell array as shown in FIG. 2A, taken along the line b-b' in accordance with one embodiment of the instant disclosure. The cross-sectional view along line b-b' reveals the lateral structural layout of the Vss/OD strap cell (210) along the second level Vss line (M2: Vss) extending substantially in the row direction (x-axis). Due to the lack of need for an in-substrate isolation device (e.g., a STI), the base region of a Vss/OD strap cell (210) integrally shares the same continuous OD layer with the adjacent sub cell array (200), defining a integrally joined active strap layer. Accordingly, the active strap layer region of the Vss/OD strap cell (210) may be seen as an integral extension of the continuous blanketing OD layer of the adjacent sub-cell-array (200). In the instant example, the x-cell pitch of a Vss/OD strap cell (210) matches substantially to four unit x-cell-pitches. Moreover, from this particular point of view, we can see the four first level bit-lines (BL-X . . . BL-X+3) arranged above the substrate surface and extending across the cell array (in and out of page in FIG. 3B) at substantially regular intervals.

Between bit-lines (BL-X) and (BL-X+1) is an interposing first level Vss lines (211) arranged substantially abreast thereto, extending along the column direction (y-axis). Further, above the first level conducting lines (M1), an elevated second level Vss line (M2: Vss) extends across the Vss/OD strap cell (210) region along the row-direction (x-axis). The common source region of the unit cell structures in a sub-cell-array (200) is connected to a first level Vss line (211) through suitable conducting arrangements, which may include a combination of an strap layer OD contact (212) and a first level via (213), and eventually connected to the second level Vss line (M2: Vss) through suitable conducting arrangements such as a second level via (214). For the ease of reference, the conductive elements between the common OD region of the Vss/OD strap cell and the M2: VSS conductor are collectively referred to as a first connecting module.

The number and pitch separation of the first level VSS lines (211) generally depends on practical needs or specific operational requirements. In some embodiments, more than one first level Vss line (211) may be deployed above a sub-cell-array to establish additional connections from different regions of the common source OD layer to the second level Vss line (M2: Vss). For example, the instant embodiment employs a second M1: Vss line (211) between bit-lines (BL-X+2) and (BL-X+3) for providing additional routings from the common source OD region to the second level Vss line (M2: Vss). As the strap layer contacts (212) are arranged outside the sub-cell-array (200) regions, the inter-array area may be saved and thus greater cell-array-density can be achieved.

Figure 2B:
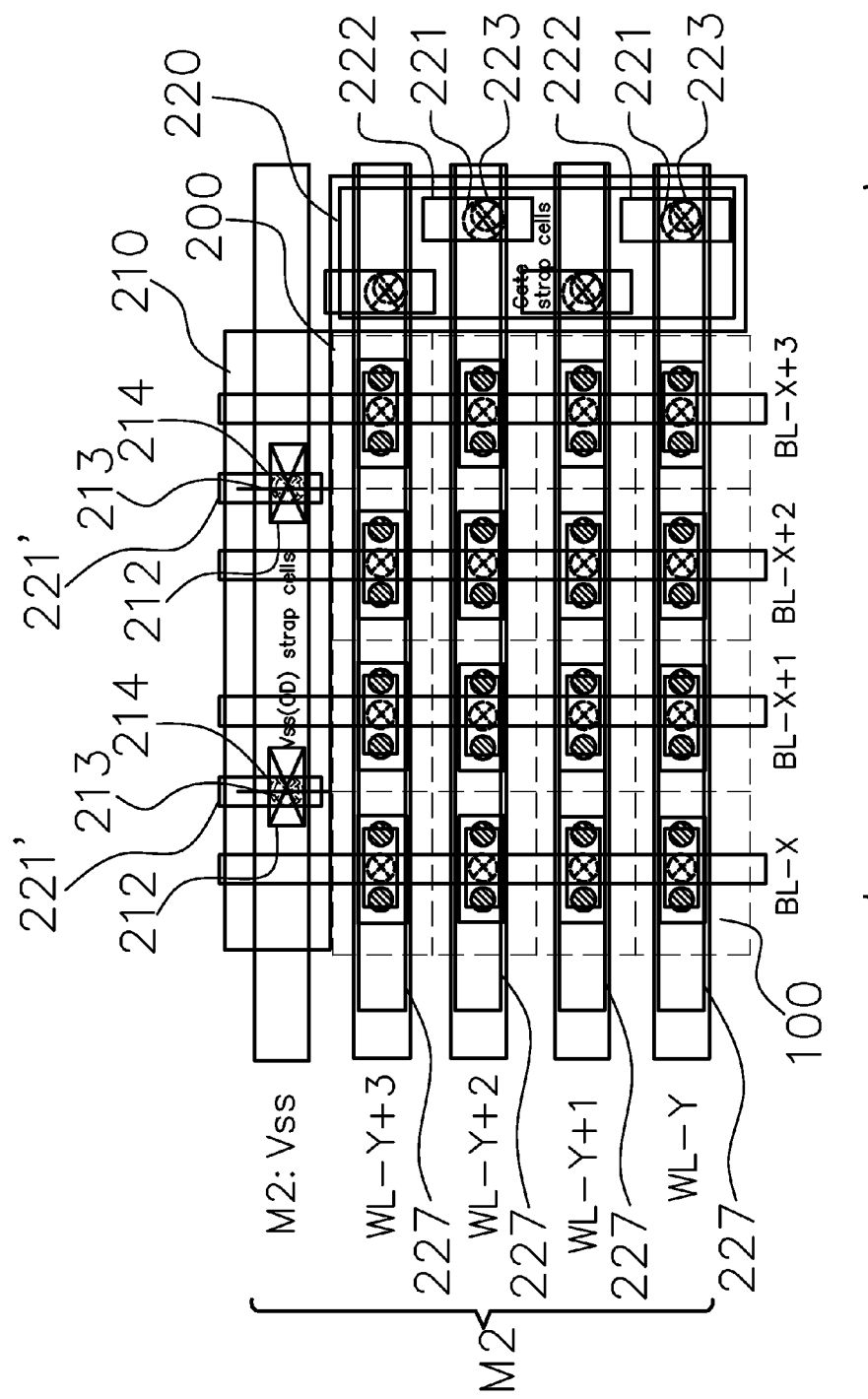
FIG. 2B shows an overhead structural diagram illustrating a layout implementation of a portion of a memory cell array in accordance with another embodiment of the instant disclosure.

The long trans-array configuration of the M1: Vss lines (211) as shown in FIG. 2A provides fabrication convenience, as these columns of elevated crossing lines share similar structural profiles with the columns of the longitudinally extending bit-lines (e.g., BL-X), and thus can be fabricated in the same procedure using similar methods. However, in some embodiments, shortened first level Vss lines may be adapted to enable further increased inter-sub-array cell density and/or to reduce potential parasitic capacitance. For example, please refer to FIG. 2B, which shows an overhead structural diagram illustrating a layout implementation of a portion of a memory cell array in accordance with another embodiment of the instant disclosure. Specifically, the shortened first level Vss line (211') is arranged substantially within the Vss/OD strap cell (210) region without entering into the vertical projecting area of the sub-cell-array (200) region.

Referring to FIG. 3B, as mentioned previously, in some embodiments, the coding of the ROM cell may be implemented through selective deployment of a conductive arrangement between the top drain node (e.g., drain pad (121)) of a cell transistor and a corresponding first level bit-line (M1: BL). In this case, the conducting element(s) that establishes connection between the cell transistor drain node and the corresponding bit-line serves as a coding layer. As an alternative, the coding of a ROM cell region may be implemented by the selective connection between a source node region of the sub-cell-array to the second level VSS conductor (M2: Vss) through the first connecting module. In this case, the first connecting module between a common source OD layer in a particular sub-cell-array region and the Vss would serve as the coding layer instead, and respectively produce logical states of "on" and "off" in the corresponding ROM cells.

Please refer to FIG. 2A in conjunction with FIG. 3A, which shows a lateral cross-sectional view of the memory cell array as shown in FIG. 2A, taken along the line a-a' in accordance with one embodiment of the instant disclosure. The cross-sectional view along line a-a' reveals the lateral structural layout of the sub-cell-array (200) in the row-direction along the first word-line (WL-Y), as well as a transverse section of the gate strap cell (220) that connects to the sub cell array (200) on the right hand side. Specifically, this particular point of view reveals the lateral transverse layout of a sub-cell row array, which comprises a continuous, trans-cell OD layer of heavy n-type species arranged on a p-type well in a silicon based substrate, defining a continuous common source for the vertical channel cell transistors. Similar to the Vss/OD strap cell (210), without an in-substrate isolation structure (e.g., STI) planted there-between, the base region of the gate strap cell (220) may share the same continuous OD layer with the sub-cell-array (200), thus increasing structural simplicity and hence reducing fabrication complexity.

Referring to FIGS. 2A and 3A, four vertical channel devices are substantially regularly spaced along the row-direction (x-axis) and arranged on the OD layer within their respective x-pitch cell boundaries (P-X). Each of the cell transistors has a vertically extending channel that connects to a respective top drain pad arranged projectingly above the OD layer in a respective cell boundary. The top drain pad of the each cell transistor is then in selective connection with a first level bit-line (e.g., BL-X) through suitable deployment of conductive structures, e.g., silicide pads and/or first level via, depending on the particular coding requirement for each ROM cell. A second level word-line (e.g., WL-Y) is elevatedly arranged above and across the first level lines (M1) and the row direction of the sub cell array (200), and extends continuously to the region above the gate strap cell (220).

Since the structural arrangements and implementations of the unit cell structure (100) has been depicted previously, repeated discussion will be omitted for brevity. However, it is worth noting that, in the instant embodiment, a continuous all-around gate (227) is utilized, which laterally extends along the row-direction (x-axis) and sequentially surrounds the vertical channels of the four row cell transistors. The continuous gate structure (227) extends further to the region above the gate strap cell (220) (underneath the second level word-line (WL-Y)). The continuous gate (227) is in turn connected to the word-line (WL-Y) through suitable conducting arrangements collectively referred to as a second connecting module (which may include a combination of gate contact (221), a first level conductor (222), a second level via (223), etc). Specifically, the connection arrangements (i.e., the second connecting module) between each of the continuous gate lines (227) and the respective word-lines (e.g., WL-Y) are collectively arranged within the vertical projecting area of the gate strap cell (220). In other words, all the gate nodes of the cell transistors in the sub cell array (200) are eventually connected to a corresponding word-line through a respective second conducting module disposed in the planar boundary defined by the gate strap cell (220).

The size of the sub cell array (200) is selected according to specific operational requirements and other practical concerns. For one thing, the routing length of the continuous gate (227) presents a practical concern in the determination of sub cell array size. Specifically, the exemplary cell array shown in FIG. 2A employs a [4R×4C] sub-cell-array (200), where a continuous all-around gate line layer (227) spans across the row-direction of the sub-cell-array (200) and sequentially intercepts the vertical channels of the respective cell transistors in the particular row. As the column and the row directions in a cell array are mainly designated for orientation referencing purposes and thus are essentially interchangeable, the routing length of the continuous gate is substantially equal to the sum of the X-cell-pitches (P-X) of the unit cell structures in a sub array row (or Y-pitch, should we swap the column and row directions). An overly large sub cell array size (particularly in the row/gate line direction) would require a correspondingly prolonged gate line routing arrangement. However, an over-stretching gate line that traverses across too many cell-pitches may result in undesirable diminishing in the channel control performance. Accordingly, while the choice of sub-cell-array size is generally dependent on the specific operational requirements and thus should not be limited to the arrangements illustrated in the present examples, a proper sub-array size should be maintained to ensure optimal gate line performance.

FIG. 4 shows an overhead schematic diagram of a memory cell array in accordance to one embodiment of the instant disclosure. Specifically, the exemplary ROM cell array comprises a plurality of cell regions of three different types, as previously described: a plurality of sub-cell-array (400) regions occupying the majority area in the cell array; a plurality of Vss/OD strap cell (410) regions, each having a transversely extending long narrow profile and arranged immediately adjacent to a respective sub-cell-array (400) along a column direction; and a plurality of gate strap cell (420) regions, each having a longitudinally extending long narrow profile and arranged immediately adjacent to a respective sub-cell-array (400) along a row direction. Each of the sub-cell-array (400) comprises at least four unit cell structures, arranged in a [2R×2C] pattern. Moreover, all three different types of cell regions are defined on a continuous blanketing OD layer of a substrate. Generally, the layout arrangement of the ROM cell array, e.g., the choice of sub-cell-array size and the number and pitch interval of the crossing VSS lines, should be dependent on the specific operational requirements and/or other practical design considerations. Nevertheless, a proper sub-array size should be maintained to ensure optimal gate line performance. As all three different types of cells in the exemplary ROM cell array share a continuous OD layer with no STI implanted there-between, the omission of the in-substrate isolation structures allows more effective utilization of the limited substrate planar space.

As the general architectural arrangement of a vertical channel device fares favorably against the conventional planar devices in terms of horizontal footprint, the utilization of vertical channel devices in ROM cell arrays may advantageously increase the memory cell density. In addition, the employment of a continuous wide OD as the source nodes local ground (VSS) connection path removes the space-taking inter-cell isolations, and may further allow a transistor (nanowire) coding scheme for leakage reduction as well as via-to-drain contact coding scheme for bit-line capacitance reduction.

Accordingly, one aspect of the instant disclosure provides a semiconductor read-only memory (ROM) cell structure that comprises: an cell base region defining a cell boundary, which comprises a blanket OD layer having a wide-block profile arranged on a substrate and defining a continuous common source, arranged in selective connection with a ground (Vss); a drain pad disposed above the active region, arranged in selectively connected with a bit line; a vertical channel structure bridging between the drain pad and the OD layer; and a gate structure disposed vertically between the drain pad and the OD layer and arranged in connection with a word-line; where the cell boundary is defined entirely within the coverage of the OD layer.

Accordingly, another aspect of the instant disclosure provides a semiconductor memory cell array coupled to a plurality rows of bit-lines and a plurality columns of word-lines. The memory cell array comprises: a plurality of sub-cell-arrays arranged along the column direction, each sub-cell-array comprising a plurality of unit cell structures, each comprising: an cell base region defining a cell boundary, comprising an blanket OD layer having a wide-block profile arranged on a substrate and defining a continuous common source node, a drain pad disposed above the OD layer, arranged in selectively connection with a bit line, a vertical channel structure bridging between the drain pad and the OD layer, and a gate structure disposed vertically between the drain pad and the OD layer and arranged in connection with a word-line, wherein the sub-cell-array boundary is defined entirely within the coverage of the OD layer.

Moreover, the ROM cell array may further comprise a plurality of OD strap cells, each arranged respectively adjacent to a sub-cell-array along the column direction. Each OD strap cell comprises: an OD strap layer that is an integral extension of the OD layer of the adjacent sub-cell-array; and at least one first connecting module disposed on the OD strap layer.

Furthermore, the ROM cell array may further comprise a plurality of gate strap cells, each respectively arranged adjacent to a sub cell array along the row direction. Each gate strap cell comprises: a plurality of continuous gate line layer sequentially connecting a plurality of the vertical channel structures in a row of the sub-cell-array, and a plurality of second connection modules, each respectively connecting a continuous gate line layer to a word-line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor read-only memory (ROM) unit cell structure comprising:
   a cell base region defining a cell boundary, comprising a blanket OD layer having a wide-block profile disposed on a substrate and defining a continuous common source node, arranged in selective connection with a ground (Vss);
   a drain pad disposed above the OD layer selectively connected with a bit line;
   a vertical channel structure bridging the drain pad and the OD layer; and
   a gate structure disposed vertically between the drain pad and the OD layer and connected with a word-line;
   wherein the cell boundary is defined within the coverage of the OD layer.

2. The cell structure of claim 1, wherein an OD contact for the unit cell structure is located outside the cell boundary.

3. The cell structure of claim 1,
   wherein the OD layer is n-type epi-grown compound material on a p-type well in a silicon based substrate;
   wherein the material of epi-grown compound is selected from the group consisting of SiP content, SiC content, SiPC, Si, Ge, III-V material, and a combination thereof.

4. The cell structure of claim 1, wherein the bit-line is arranged in a first level conducting layer, and the word-line is arranged in a second level conduction layer.

5. The cell structure of claim 1, wherein the OD layer is a heavy n-type species on a p-type well in a silicon based substrate.

6. The cell structure of claim 5, further comprising a silicide layer selectively disposed on the OD layer and drain pad, the material of the silicide layer being selected from the group consisting of Ti, Co, Ni, Mo, Pt, and a combination of.

7. The cell structure of claim 1, wherein the vertical structure device comprises vertical nano-channel transistors, each cell structure comprises a plurality of vertical nano-channel transistors, and the drain pad is selectively connected to a bit-line through a coding layer.

8. The cell structure of claim 7, wherein the coding layer comprises at least one of a drain pad contact layer and a first level via.

9. The cell structure of claim 8, wherein the vertical nanowire transistor is a vertical gate all-around (VGAA) transistor.

10. A semiconductor memory cell array coupled to a plurality rows of bit-lines and a plurality columns of word-lines, comprising:
    a plurality of sub-cell-arrays arranged along the column direction, each sub-cell-array comprising a plurality of unit cell structures, each comprising:
      a cell base region defining a cell boundary comprising a blanket OD layer having a wide-block profile arranged on a substrate and defining a continuous common source node,
      a drain pad disposed above the OD layer selectively connected with a bit line,
      a vertical channel structure bridging the drain pad and the OD layer,
      a gate structure disposed vertically between the drain pad and the OD layer and selectively connected with a word-line,
    wherein the sub-cell-array boundary is defined within the coverage of the OD layer.

11. The cell array of claim 10, further comprising:
    a plurality of OD strap cells, each arranged respectively adjacent to a sub-cell-array along the column direction, each comprising:
      an OD strap layer that is an integral extension of the OD layer of the adjacent sub-cell-array; and
      at least one first connecting module disposed on the OD strap layer.

12. The cell array of claim 11, further comprising:
    a plurality of gate strap cells, each respectively arranged adjacent to a sub cell array along the row direction, each comprising:
      a plurality of continuous gate line layer sequentially connecting a plurality of the vertical channel structures in a row of the sub-cell-array, and
      a plurality of second connection modules, each respectively connecting a continuous gate line layer to a word-line.

13. The cell array of claim 12, wherein the second connection module comprises at least one of a gate contact, a first level conducting layer, and a second level via.

14. The cell array of claim 11, wherein the first connecting module selectively establishes connection from the common source node of the sub-cell-array to a ground (Vss).

15. The cell array of claim 14, further comprising at least one first level Vss line arranged above each of the OD strap cells between a pair of adjacent bit-lines.

16. The cell array of claim 15, wherein the first level Vss line extends along the column direction and into the sub-cell-array region and the first level Vss line shares substantially identical structural profile with a bit-line.

17. The column array of claim 15, wherein the first level Vss line is arranged substantially within the respective OD strap cell region.

18. The column array of claim 15, further comprising a second level Vss line extending above and across the OD strap cell region along the row-direction.

19. The column array of claim 18, wherein the first connecting module comprises at least one of a strap layer OD contact, a first level via, a first level conducting layer, a second level via, and a second level conducting layer, and further wherein the first connecting module connects the first and the second level Vss lines.

20. The cell array of claim 19, wherein coding of the a ROM cell in the sub-cell-array is implemented through selective employment of the first level via, and further wherein a logical state of a ROM cell in the sub-cell-array is determined by a selective connection from a common source node of the sub-cell-array to the respective first level Vss line through the first level via.

* * * * *